United States Patent [19]

Uchiyama et al.

[11] Patent Number: 4,646,271

[45] Date of Patent: Feb. 24, 1987

[54] CONTENT ADDRESSABLE MEMORY HAVING DUAL ACCESS MODES

[75] Inventors: Kunio Uchiyama, Kokubunji; Tadahiko Nishimukai, Sagamihara, both of Japan

[73] Assignee: Hitachi, Ltd., Tokyo, Japan

[21] Appl. No.: 683,611

[22] Filed: Dec. 19, 1984

[30] Foreign Application Priority Data

Dec. 23, 1983 [JP] Japan ............................ 58-242012

[51] Int. Cl.$^4$ ............................................. G11C 13/00
[52] U.S. Cl. ................................. 365/49; 365/189; 364/900
[58] Field of Search ................. 365/49, 189; 364/900, 364/200

[56] References Cited

U.S. PATENT DOCUMENTS 3,402,398 9/1968 Koerner et al. ........................ 365/49
4,532,606 7/1985 Paelps ................................ 365/49

*Primary Examiner*—Terrell W. Fears
*Attorney, Agent, or Firm*—Antonelli, Terry & Wands

[57] ABSTRACT

In a memory device having a content addressable memory array and a random access memory array, the word coincidence lines and word selection lines of the content addressable memory array are connected to the word selection lines of the corresponding words of the random access memory array via a selection circuit, access is made to the random access memory array on the basis of the result of association of the content addressable memory array when the selection circuit selects the word coincidence lines, and access is made to the memory device as a whole as a random access memory array when the selection circuit selects the word selection lines.

4 Claims, 4 Drawing Figures

CONTENT ADDRESSABLE MEMORY HAVING DUAL ACCESS MODES

BACKGROUND OF THE INVENTION

This invention relates to a content addressable memory (hereinafter called "CAM").

CAM is a memory of the type which is addressable in accordance with the content for which coincidence is desired. This CAM is effective when retrieving a plurality of data in parallel with one another. The possible application of CAM in the field of computers may be an address array of cache memories, translation look-aside buffers for address conversion and various other applications. However, CAM has not yet been employed widely because the cost of CAM per bit is higher than that of a random access memory (hereinafter called "RAM"). It is expected, however, that CAM will gain a wide range application in future with further improvement in the integration density of LSI.

FIG. 1 shows a conventional content addressable memory device using CAM. Reference numerals 100 and 120 represent the array portions of CAM and RAM, respectively. Each word of CAMs 110a–110n stores the key to be retrieved. Each word of RAMs 120a–120n stores the data corresponding to each key stored in CAM. Each word of CAM is directly connected to that of RAM by signal line 130a–130n. This signal line is a word coincidence line when viewed from the CAM side, and is a word selection line when viewed from the RAM side. When the key to be retrieved is input by the signal line 140, it is compared in parallel with the key stored in each word of CAM, and the word coincidence line of the word which proves to be coincident is asserted. Therefore, the word selection line of the corresponding RAM is asserted, and the data belonging to the coincident key is read out from the RAM through the signal line 150. An example of a cache memory using such a content addressable memory device is disclosed, for example, in Japanese Patent Laid-Open No. 68,287/1983.

The first problem with a memory device of the kind described above is that the key and the data can not be stored simultaneously in the CAM and RAM. The key is temporarily stored in the CAM word, then, the RAM word selection line is selected by inputting the same key to the signal line 140; then, the data must be written into the RAM word through the signal line 150. The second problem is that an arbitrary RAM word line can not be selected easily because the RAM word selection line is directly connected to the CAM word coincidence line. In other words, it has been necessary to store in advance a predetermined key in the corresponding CAM word, and then to input that key to the CAM, in order to select a particular RAM word line.

SUMMARY OF THE INVENTION

The present invention is therefore directed to provide a content addressable memory device which eliminates the problems of the prior art devices described above, requires only a limited increase in hardware and yet has a regular structure suitable for fabrication in the VLSI arrangement.

In order to solve the problems of the prior art devices described above, the present invention disposes a selector between each word coincidence line on the CAM side and each word selection line on the RAM side, one of the inputs of the selector is used as the CAM word coincidence line and the other is used as the CAM word selection line with the selector output being connected to the RAM word selection line. According to this structure, the memory device can be used while utilizing fully the content addressable memory by selecting the selector input word coincidence line, and the memory device can be used as a whole as a RAM by selecting the selector input word selection line.

DESCRIPTION OF THE PREFERRED EMBODIMENT

Figure 1:
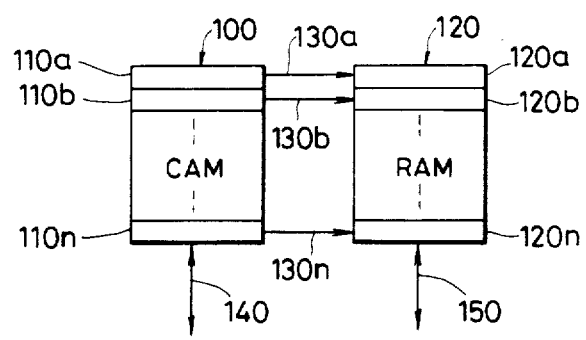
FIG. 1 shows the structure of a prior art device.
Figure 2:
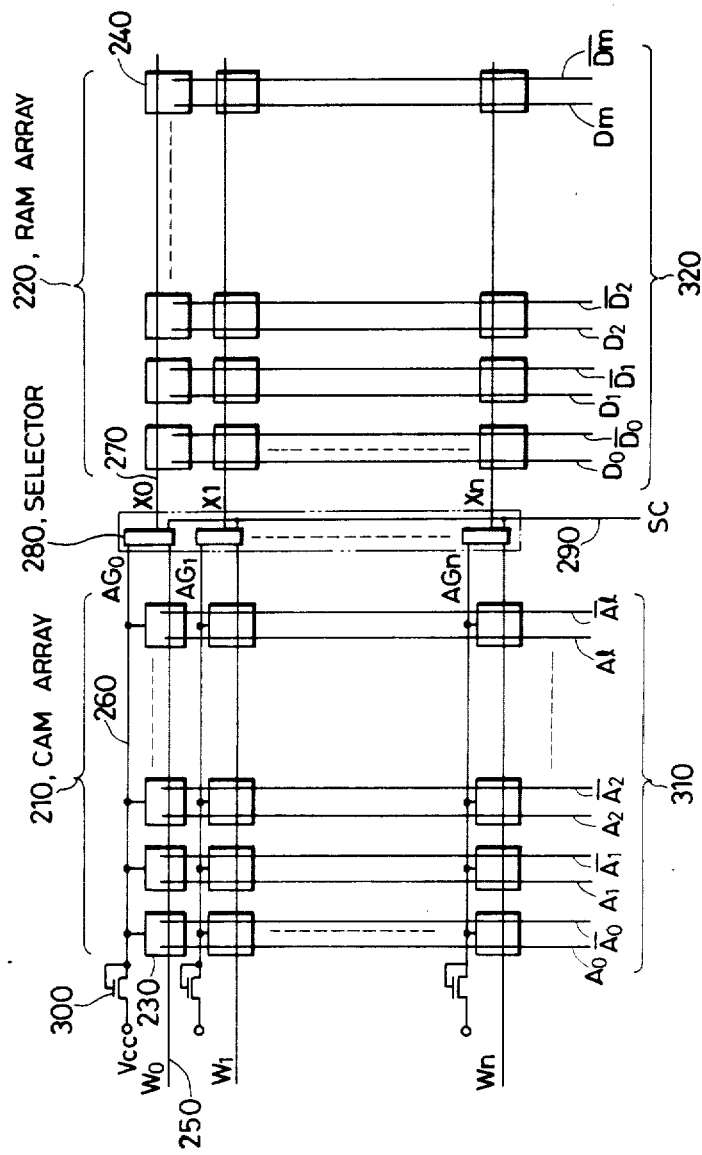
FIG. 2 shows the overall structure of the content addressable memory device in accordance with one embodiment of the present invention.

Hereinafter, one embodiment of the present invention will be described in detail with reference to the accompanying drawings. FIG. 2 shows the overall structure of the content addressable memory device. This device has a CAM array 210 and an RAM array 220. The CAM array has an b bit by n-word construction, and each bit consists of one CAM cell 230. Each word of the CAM array consists of l CAM cells 230, and each cell is connected in the word unit to a word selection line 250 ($w_o$–$w_n$) on the CAM side and to a word coincidence line 260. A load MOS transistor 300 is connected to one of the ends of each word coincidence line 260, and the other side of the MOS transistor 300 is connected to a power source ($V_{cc}$). Each cell 230 of the CAM array 210 (hereinafter called "CAM cell") is connected in each bit to a data line $A_o$, $\overline{A_o}$–Al, $\overline{Al}$). The data line of each bit consists of two lines having opposite polarities.

The RAM array 220 has m-bit by n-word construction, and each bit consists of one cell 240 (hereinafter called "RAM cell"). Each word of the RAM array 220 consists of m RAM cells 240, and each cell is connected in the word unit to a word selection line ($X_o$–$X_n$) on the RAM side. Each RAM cell 240 of the RAM array 220 is connected in the bit line unit to a data line ($D_o$, $\overline{D_o}$–$D_m$, $\overline{D_m}$). The data line of each bit consists of two lines having opposite polarities with each other.

A selector 280 having two-input and n-bit construction is interposed between the CAM array 210 and the RAM array 220. N selectors 280 are disposed so as to correspond to the number of the words of the CAM array 210 and RAM array 220. One of the inputs of the selector 280 is connected to the word coincidence line 260 of the CAM array 210, and the other input is connected to the word selection line 250 on the CAM side. The output of the selector 280 is connected to the word selection line 270 on the RAM side. Input selection of the selector 280 is controlled by a selector control line (hereinafter called "SC") 290. In other words, when SC 290 is asserted, the word coincidence line 260 is selected, and when SC 290 is negated, the word selection line 250 on the CAM side is selected.

The structure of the device described above is so regular that it can be easily accomplished with LSIs.

Figure 3:
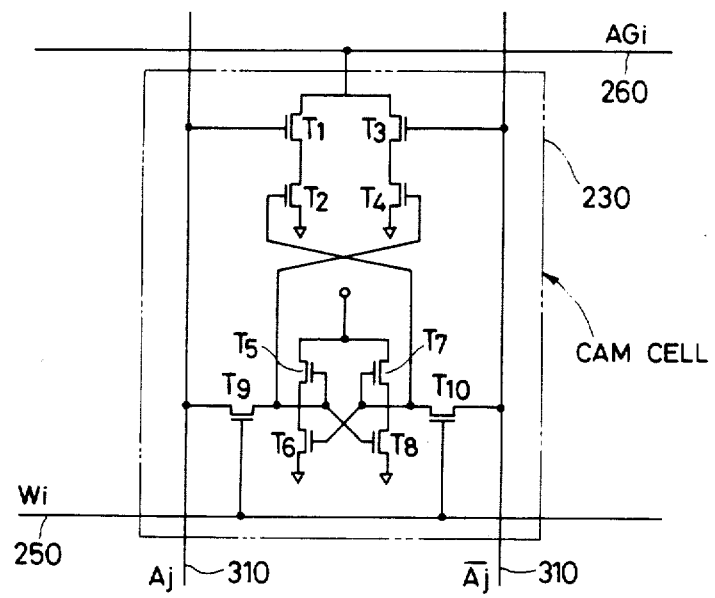
FIG. 3 is a circuit diagram of a CAM cell.
Figure 4:
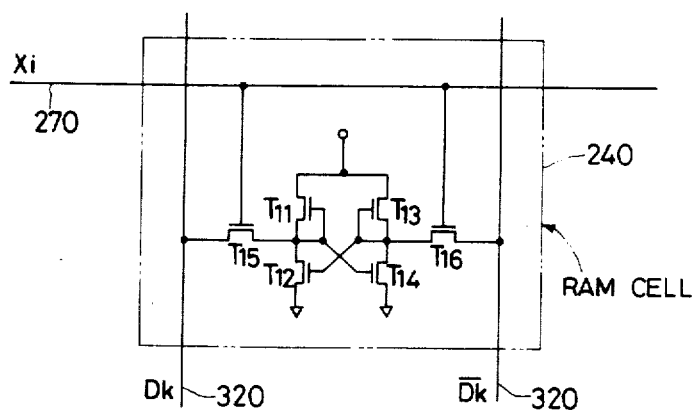
FIG. 4 is a circuit diagram of an RAM cell.

FIGS. 3 and 4 show the examples of the circuits of CAM cell 230 and RAM cell 240, respectively. MOS transistors $T_5$–$T_8$ in FIG. 3 and MOS transistors $T_{11}$–$T_{14}$ in FIG. 4 constitute static flip-flops, respectively, each storing one-bit data. When the word selection line (Wi) 250 on the CAM side or the word selection line (Xi) 270 on the RAM side is asserted, the MOS transistors $T_9$, $T_{10}$ or $T_{15}$, $T_{16}$ are turned on, the data is read out from the data line (Aj, $\overline{Aj}$) 310 or the data line (Dk, $\overline{Dk}$) 320. In order to write the data, the word selection line is asserted, and the data is applied to the data line.

The CAM cell 230 shown in FIG. 3 has the function of judging whether or not the data stored in the flip-flops $T_5$-$T_8$ are coincident with the data on the data line 310. The MOS transistors $T_1$-$T_4$ bear that function. When the data are not coincident, both of the MOS transistors $T_1$ and $T_2$ are turned on or both of the MOS transistors $T_3$ and $T_4$ are turned on, and the word coincidence line 260 is grounded. Since the word line 260 is connected to all the bits of the CAM cell 230 constituting the word as shown in FIG. 2, when the l-bit data that are applied to the data line 310 and the data stored in the word of the CAM array 210 are not coincident with each other, the corresponding word coincidence line 260 is grounded, that is, the line is negated. When they are coincident, on the other hand, it has a high voltage level and is brought into the asserted state. In this manner, the content of each word is retrieved by applying the data to the data line 310 of the CAM array 210, and the word coincidence line 260 corresponding to the coincident word is asserted.

The content addressable memory device shown in FIG. 2 has substantially two modes. In one of the modes, the associative function of the CAM array 210 is utilized fully, and the access is made to the RAM array 220 in accordance with the result of association. This is realized by asserting SC 290. Under this state, the word coincidence line 260 of each word of the CAM and RAM arrays 210, 220 is connected to the word selection line 240 on the RAM side, as described earlier. When the data is applied to the data line 310 on the CAM side, therefore, the word coincidence line 260 corresponding to the word of the CAM array 210, in which the content which is concident with that data is stored, is asserted, and the word selection line 270 of the corresponding RAM array 220 is further asserted, so that the data stored in that word is read out on the data line 320 on the RAM side. If the data is applied to the data line 320 on the RAM side under this state, the data is written into the selected word.

The other mode of the content addressable memory device is the mode in which the device is used as a whole in the same way as an ordinary RAM array. This is realized by negating SC 290. Under this state, the word selection line 250 on the CAM side of each word of the CAM and RAM arrays 210, 220 is connected to the word selection line 270 on the RAM side via the selector 280. Therefore, an RAM array having a (l+m) bit by n-word construction is constituted as a whole. When the word selection line 250 on the CAM side is asserted, the corresponding word selection line 270 on the RAM side is also asserted, and the word selection lines of the (l+m) bit cells are asserted as a whole. Accordingly, read-out/write-in corresponding to the same word of the CAM and RAM arrays can be made simultaneously.

Since the content addressable memory device in accordance with the present invention has a regular construction, it is suitable for VLSI, and the chip area can be utilized effectively because an unnecessary wiring area is not necessary.

As can be seen from the above description, it is possible to address the RAM array in accordance with the result of association of the CAM array, and to access the whole device as the RAM array.

Therefore, the operation of storing the key in the CAM word and the operation of writing the data in the RAM word can be made simultaneously.

Furthermore, an arbitrary word RAM line can be easily selected, and the data writing operation to the RAM can be simplified.

As described above, the present invention can provide a content addressable memory device having extremely high versatility and a wide range of application.

What is claimed is:

1. A content addressable memory device comprising:
 a content addressable memory array having word coincidence lines, word selection lines and data lines;
 a random access memory array having word selection lines and data lines; and
 means responsive to a control signal for selecting either the word coincidence lines or the word selection lines of said content addressable memory array and for connecting the selected lines to the word selection lines of said random access memory array.

2. The content addressable memory device as defined in claim 1 wherein said content addressable memory array consists of a plurality of cells, each cell being connected to a word selection line, a word coincidence line and a data line, and including means for storing data received on the data line when the word selection line is selected and means for comparing the data on said data line with the stored data of said storing means and for changing the potential level of the word coincidence line on the basis of the result of comparison.

3. The content addressable memory device as defined in claim 2 wherein said storing means in each cell consists of a flip-flop.

4. The content addressable memory device as defined in claim 1 wherein the number of the data lines of said content addressable memory array is different from the number of the data lines of said random access memory array.

* * * * *

REEXAMINATION CERTIFICATE (2073rd)

United States Patent [19]

Uchiyama et al.

[11] B1 4,646,271

[45] Certificate Issued  Aug. 3, 1993

[54] CONTENT ADDRESSABLE MEMORY HAVING DUAL ACCESS MODES

[75] Inventors: Kunio Uchiyama, Kokubunji; Tadahiko Nishimukai, Sagamihara, both of Japan

[73] Assignee: Hitachi, Ltd., Tokyo, Japan

Reexamination Request:
No. 90/002,033, May 31, 1990

Reexamination Certificate for:
Patent No.: 4,646,271
Issued: Feb. 24, 1987
Appl. No.: 683,611
Filed: Dec. 19, 1984

[30] Foreign Application Priority Data

Dec. 23, 1983 [JP] Japan .................. 58-242012

[51] Int. Cl.⁵ .................................. G11C 13/06
[52] U.S. Cl. ........................ 365/49; 365/189.01; 365/189.03; 365/189.04; 365/189.08; 365/230.09; 365/190; 364/953; 364/954; 364/954.3; 364/958.5; 364/959.1; 364/961.3; 364/963; 364/963.1; 364/964; 364/964.7; 364/DIG. 2
[58] Field of Search ............. 365/49, 189.01, 230.01, 365/230.05, 230.03

[56] References Cited

U.S. PATENT DOCUMENTS

| | | | |
|---|---|---|---|
| 3,093,814 | 6/1963 | Wagner | 340/172.5 |
| 3,275,991 | 9/1966 | Schneberger | 340/172.5 |
| 3,633,175 | 1/1972 | Harper | 340/172.5 |
| 3,685,020 | 8/1972 | Meade | 340/172.5 |
| 3,868,642 | 2/1975 | Sachs | 365/49 |
| 3,903,370 | 9/1975 | Carbrey | 179/15 AT |
| 4,084,225 | 4/1978 | Anderson | 364/200 |
| 4,084,226 | 4/1978 | Anderson | 364/200 |
| 4,084,227 | 4/1978 | Bennett | 364/200 |
| 4,096,568 | 6/1978 | Bennett | 364/200 |
| 4,332,010 | 5/1982 | Messina | 364/200 |

OTHER PUBLICATIONS

Fairchild MuL9035 Memory Micrologic ® integrated circuit; pp. 3-165 to 3-168 in the Fairchild Semiconductor Integrated Circuit Data Catalog 1970.

RCA CD40257B CMOS/MOS Quad 2-Line-to-Line Data Selector/Multiplexer; pp. 438–440 of RCA CMOS/MOS Integrated Circuits Databook Copyright 1980.

Slechta, "The Virtual Address Translator," *IEEE Aerospace and Electronics*, vol. II, No. 5 (1975).

*Texas Instruments MOS LSI Standard Products Catalog*, Pub. No. CC402 (Jul. 1971), including TMS 4000 at pp. 260–266.

Hodges, ed., *Semiconductor Memories*, IEEE Press (1972), including data sheet for Intel 3104 at pp. 263–278.

Kohonen, *Content Addressable Memories*, Springer–Verlag (1980, 1987).

*MSI-LSI Memory D.A.T.A. Book*, 9th ed., D.A.T.A., Inc. (1975).

*MSI-LSI Semiconductor Memories*, 13th ed., vol. 2, D.A.T.A., Inc. (1977).

*Signetics Digital–Linear–MOS Data Book*, Signetics Corporation (1972 and 1974 edons) and *Signetics Digital–Linear–MOS Applications*, Signetics Corporation (1974), including Signetics 8220.

*Signetics Bipolar & MOS Memory*, Signetics Corporation (1977), including Signetics 10155.

Hnatek, *A User's Handbook of Semiconductor Memories*, Wiley (1977), pp. 591–608.

Cirovic, *Handbook of Semiconductor Memories*, Reston Publishing Company, Inc. (1981).

Lea, "The Comparative Cost of Associative Memory," *The Radio and Electronic Engineer*, vol. 46, No. 10 (Oct., 1976).

Koo, "Integrated Circuit Content Addressable Memories," *IEEE Journal of Solid State Circuits*, vol. SC-5, pp. 208–215 (Oct. 1970).

Koo, "Integrated Circuit Content Addressable Memories", Digest of Technical Papers, *IEEE International Solid–State Circuits Conference* (1970).

Carlstedt et al, "A Content-Addressable Memory Cell With MNOS Transistors," *IEEE Journal of Solid State Circuits* (Oct. 1973).

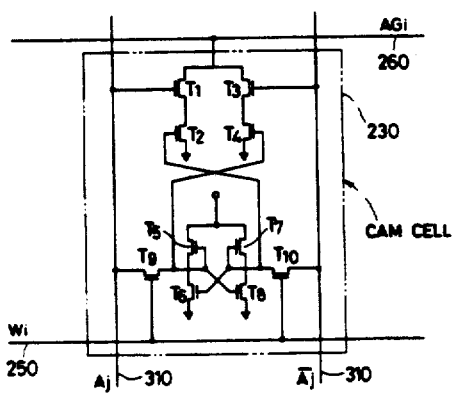

Mundy, et al, "Low-Cost Associative Memory," *IEEE Journal of Solid-State Circuits* (Oct. 1972).

Igarashi and Yaita, "An Integrated MOS Transistor Associative Memory System with 100 ns Cycle Time," AFIPS Conference Proceedings, vol. 30, pp. 499-506 (1967).

Erwin and Jensen, "Interrupt Processing with Queued Content-addressable Memories," AFIPS Conference Proceedings, vol. 37 pp. 621-627 (1970).

*Primary Examiner*—Terrell W. Fears

[57] ABSTRACT

In a memory device having a content addressable memory array and a random access memory array, the word coincidence lines and word selection lines of the content addressable memory array are connected to the word selection lines of the corresponding words of the random access memory array via a selection circuit, access is made to the random access memory array on the basis of the result of association of the content addressable memory array when the selection circuit selects the word coincidence lines, and access is made to the memory device as a whole as a random access memory array when the selection circuit selects the word selection lines.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2-4, dependent on an amended claim, is determined to be patentable.

New claims 5-16 are added and determined to be patentable.

1. A content addressable memory device comprising:
a content addressable memory array having word coincidence lines, word selection lines and data lines;
a random access memory array having word selection lines and data lines; and
means responsive to a control signal for selecting [either] the word coincidence lines [or] *of said content addressable memory array in a first access mode and* the word selection lines of said content addressable memory array *in a second access mode* and for connecting the selected lines to the word selection lines of said random access memory array *so that said arrays are accessed as a content addressable memory in said first access mode and as a random access memory in said second access mode.*

5. *A content addressable memory device, comprising:*
*a content addressable memory array having word coincidence lines, word selection lines and data lines;*
*a random access memory array having word selection lines and data lines; and*
*mode control means responsive to an applied mode control signal for selectively connecting said content addressable memory array with said random access memory array to operate the combination of said content addressable memory array and said random access memory array in a first mode as a content addressable memory and in a second mode as a random access memory for performing accessing operations according to the state of said mode control signal.*

6. *A content addressable memory device according to claim 5, wherein said mode control means comprises a plurality of selectors each connecting a word coincidence line of said content addressable memory array in said first mode and a word selection line of said content addressable memory array of said second mode with a word selection line of said random access memory array according to the state of said mode control signal.*

7. *A content addressable memory device according to claim 5, wherein said mode control means comprises selector means connected between said content addressable memory array and said random access memory array for allowing only signals from word coincidence lines of said content addressable memory array to be applied to word selection lines of said random access memory array when said mode control signal is in a first state and for allowing only signals from word selection lines of said content addressable memory array to be applied to word selection lines of said random access memory array when said mode control signal is in a second state.*

8. *A content addressable memory device, comrpising: a content addressable memory array having a plurality of memory cells arranged in plural lines and columns, a respective word coincidence line connected to each line of cells, a respective word selection line connected to each line of cells, and a respective data line connected to each column of cells;*
*a random access memory array having a plurality of memory cells arranged in plural lines and columns, a respective word selection line connected to each line of cells and a respective data line connected to each column of cells; and*
*means responsive to a control signal for connecting the word coincidence line of each line of cells in said content addressable memory array with the word selection line of a corresponding line of cells in said random access memory array for a first access mode in which access is effected on the basis of a result of association of the content addressable memory array and for connecting the word selection line of each line of cells in said content addressable memory array with the word selection line of a corresponding line of cells in said random access memory array in a second access mode, so that in said second access mode data may be simultaneously read from or written into the memory cells of any arbitrarily selected line of cells in said content addressable memory array and the corresponding line of said random access memory array.*

9. *A content addressable memory device according to claim 8, wherein said connecting means comprises a plurality of selectors each connecting a word coincidence line of said content addressable memory array in said first mode and a word selection line of said content addressable memory array in said second mode with a word selection line of said random access memory array according to the state of said control signal.*

10. *A content addressable memory device, comprising:*
*a content addressable memory array having word coincidence lines, word selection lines and data lines;*
*a random access memory array having word selection lines and data lines; and*
*control means responsive to an applied control signal for selectively connecting said content addressable memory array with said random access memory array for either of first and second modes of operation, so that, in said first mode of operation, a word selection line in said random access memory array can be enabled in response to application of a key to said content addressable memory array and, in said second mode of operation, a word selection line in said random access memory array can be enabled arbitrarily with a corresponding word selection line in said content addressable memory array without applying a key thereto;*
*wherein said control means comprises selector means connected between said content addressable memory array and said random access memory array for allowing only signals from word coincidence lines of said control addressable memory array to be applied to word selection lines of said random access memory array when said control signal is in a first state and for allowing only signals from word selection lines of said* content addressable memory array to be applied to word selection lines of said random access memory array when said control signal is in a second state.

11. A content addressable memory, comprising:
a content addressable memory array having word coincidence lines, word selection lines and data lines;
a random access memory array having word selection lines and data lines; and
control means responsive to an applied control signal for selectively connecting said content addressable memory array with said random access memory array for either of first and second modes of operation, so that, in said first mode of operation, a word selection line in said random access memory array can be enabled in response to application of a key to said content addressable memory array and, in said second mode of operation, a word selection line in said random access memory array can be enabled arbitrarily with a corresponding word selection line in said content addressable memory array without applying a key thereto;
wherein said control means includes a plurality of two-input selectors each having a first input connected to a respective one of said word coincidence lines of said content addressable memory array, a second input connected to a respective one of said word selection lines of said content addressable memory array and an output connected to a respective one of said word selection lines of said random access memory array, said selectors being responsive to said control signal for selectively connecting one of said first and second inputs to said output thereof.

12. A content addressable memory device according to claim 5, wherein said content addressable memory array includes a plurality of cells, each cell having a static type flip-flop in the form of a MOS transistor circuit for storing one-bit data of said key to said content addressable memory array and a judgement circuit in the form of a MOS transistor circuit for judging whether or not the one-bit data stored in said static type flip-flop is coincident with data of a corresponding data line of said content addressable memory array and for controlling the potential of a corresponding word coincidence line of said content addressable memory array in response to the judging, and wherein said random access memory array includes a plurality of cells, each cell having a static type flip-flop in the form of a MOS transistor circuit for storing one-bit data of plural-bit data to said random access memory array.

13. A content addressable memory device according to claim 12, wherein said data lines of said content addressable memory array are bidirectional so that keys may be read from or written into cells of said content addressable memory array, and wherein said data lines of said random access memory array are bidirectional so that data may be read from or written into cells of said random access memory array.

14. A content addressable memory device according to claim 13, wherein said content addressable memory array, said random access memory array and said control circuit are in a chip of VLSI.

15. A content addressable memory device according to claim 12, wherein said content addressable memory array has a plurality of complementary data line pairs respectively connected to columns of cells, said static type flip-flops of the cells each including two storing nodes, two MOS inverters with cross-coupled inputs and outputs, a first switch MOS transistor with a source-drain current path connected between one line of a complementary data line pair and one storing node and a gate connected to a word selection line, and a second switch MOS transistor with a source-drain current path connected between the other line of the complementary data line pair and the other storing node and a gate connected to the word selection line, and wherein said judgement circuit portion has a plurality of inputs respectively connected to said complementary data line pairs and said storing nodes and an output connected to a word coincidence line.

16. A content addressable memory device according to claim 12, wherein said random access memory array has a plurality of complementary data line pairs respectively connected to columns of cells, said static type flip-flops of the cells each including two storing nodes, two MOS inverters with cross-coupled inputs and outputs, a first switch MOS transistor with a source-drain current path connected between one line of a complementary data line pair and one storing node and a gate connected to a word selection line, and a second switch MOS transistor with a source-drain current path connected between the other line of the complementary data line pair and the other storing node and a gate connected to the word selection line.

* * * * *